United States Patent [19]

Shaheen et al.

[11] 4,052,787
[45] Oct. 11, 1977

[54] METHOD OF FABRICATING A BEAM LEAD FLEXIBLE CIRCUIT

[75] Inventors: Joseph M. Shaheen, La Habra; John Simone, Stanton, both of Calif.

[73] Assignee: Rockwell International Corporation, El Segundo, Calif.

[21] Appl. No.: 641,806

[22] Filed: Dec. 18, 1975

[51] Int. Cl.² .............................................. H05K 3/30
[52] U.S. Cl. .................................. 29/626; 29/577 R; 29/625; 96/36.2; 156/631; 156/634; 204/38 B; 427/98
[58] Field of Search .................. 156/7, 9, 3, 323, 630, 156/631, 634, 645, 664, 665, 666, 656; 29/577, 578, 625, 626; 427/98, 96; 204/22, 30, 54 R, 38 B, 38 E; 96/36.2

[56] References Cited

U.S. PATENT DOCUMENTS

| | | | |
|---|---|---|---|
| 3,649,475 | 3/1972 | Degnan et al. | 156/3 |
| 3,666,549 | 5/1972 | Rhodenizer et al. | 427/98 |
| 3,680,209 | 8/1972 | Hacke | 156/3 |
| 3,689,991 | 9/1972 | Aird | 29/577 |
| 3,931,922 | 1/1976 | Jackson et al. | 29/626 |
| 3,953,924 | 5/1976 | Zachary et al. | 29/625 |

Primary Examiner—Charles E. Van Horn
Assistant Examiner—Jerome W. Massie
Attorney, Agent, or Firm—H. Fredrick Hamann; G. Donald Weber, Jr.; R. G. Rubalcava

[57] ABSTRACT

A method for producing beam leads, i.e. electrical contacts, on flexible circuits or multilayer circuits for interconnecting devices is disclosed. The method consists of processing a metal foil to expose a beam lead interconnection pattern, plating the exposed pattern with metal, coating a base insulating layer with an adhesive, punching cavities in the adhesive coated insulating layer, engaging the coated side of the base insulating layer to the metal foil, and applying a cushioning material on the opposite side of the adhesive coated insulating layer. The metal foil and the insulating layer are then laminated causing the cushioning material to flow into the pre-punched cavities thereby providing a protective cushioning-type backing for the metal-plated beam lead interconnection pattern. The exposed metal foil is etched away, the photoresist is removed and the cushioning material is stripped off the insulating layer leaving beam leads extending over the cavity for a device which can have the beam leads connected to its contacts (pads).

10 Claims, 8 Drawing Figures

METHOD OF FABRICATING A BEAM LEAD FLEXIBLE CIRCUIT

BACKGROUND OF THE INVENTION

1. Field of the Invention

This invention relates to beam lead flexible circuits and particularly to a process for fabricating the circuits.

2. Descripton of Prior Art

There exists a need for developing techniques for fabricating beam leaded flexible interconnections capable of being connected to all types of device chips including those manufactured in low volume. Integrated circuit chips are usually very small and include a plurality of minute wires that require bonding to external package heads. Presently, interconnections in devices are made utilizing flying leads. This technique is time-consuming, tedious and the fragile wires are easily broken during the various handling steps in assembly. Flying leads also pose another problem in that they are non-planar, therefore, when utilized in devices such as bubble memory devices they cause noise in the memory, i.e. $dQ/dT$ pickup.

Another known art technique, the beam leaded flexible circuit, is disclosed in U.S. Pat. No. 3,689,991, entitled "Method of Manufacturing a Semiconductor Device Utilizing a Flexible Carrier" by A. D. Aird. This method is directed at mass production and employs a metallic foil laminated to a flexible dielectric tape. The flexible layer utilizes an adhesive to hold the metallic foil in place. The insulating layer has centrally located space apertures. These apertures are covered by the metallic foil and are structured to encompass contact regions of a semiconductor body. Leads are formed from the metallic foil within the respective apertures for contact with an integrated circuit chip. The beam leaded flexible circuit has the advantage of providing planar interconnection boards. But this technique is dependent upon the ability to provide the beam leads over a predetermined cavity into which the die or chip fits. The leads must be free of adhesive and have a surface that is capable of being bonded to the device in a suitable manner, for example, thermo-compression bonding. This known technique may not assure that the beam leaded pattern is protected from damage during lamination to the flexible layer and during the subsequent processing steps.

SUMMARY OF THE INVENTION

In accordance with this invention, a flexible circuit having beam leads for interconnecting integrated circuit chips or dice is fabricated by a method comprising the steps of processing a metal foil to expose a desired beam lead interconnection pattern, plating the exposed interconnection pattern for both circuitry and beam leads with metal and preparing a separate base insulating layer with low flow adhesive, forming cavities in the insulating layer to be used as receptacles for device chips and engaging the adhesive coated side of the insulating layer to the plated metal foil. Plastic material is then applied to the insulating layer and flows into the cavities in the insulating layer when the insulating layer and the metal foil are laminated. The plastic material provides a protective backing for the metal-plated interconnection pattern which extends over the cavity area thereby preventing deformation or damage to the non-supported area. The plastic backing also serves as a mask in the subsequent processing steps.

The non-plated surfaces of the metal foil are then etched away, leaving plated metal-foil beam lead interconnects. The plastic backing is then peeled off the insulating layer exposing a receptacle for a device to which the beam leads can be joined. The invention is also adapted to producing a beam leaded multilayer circit.

DETAILED DESCRIPTION OF THE PREFERRED EMBODIMENT

Figure 1:
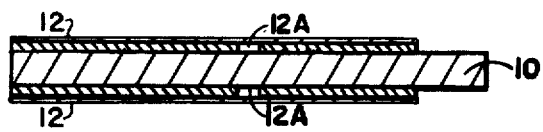
FIGS. 1 and 2 show a cross-section and a top view of the metal foil during stages of the method for forming a beam lead interconnection pattern.

Referring to FIG. 1, there is illustrated a metal foil 10 which is coated on the bottom and top surfaces with a suitable mask, such as photoresist 12. In accordance with one embodiment, foil 10 is a copper rolled, annealed sheet (approximately 1 mil thick) or electrodeposited copper of approximately one ounce per square foot (typically about 1.4 mil. thick). Of course, other suitable conductors, such as aluminum, may be used as well. Masked metal foil 10 is processed with well known photolithographic techniques to remove portions 12A of the mask thereby to expose a desired mirror image beam lead interconnection pattern in registration on both sides of metal foil 10. Desirably, prior to processing, foil 10 is pre-punched with alignment holes (not shown) which are used to locate the metal foil with respect to the insulating layer (to be discussed subsequently). This pre-punching step is desirable to assure that the beam lead pattern is positioned over the cavity area of the insulating layer.

Figure 2:
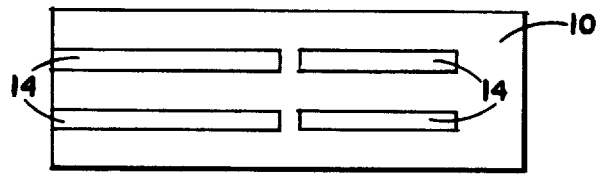

In step 2, the exposed (unmasked) surface portions of the copper foil 10 are plated with a suitable conductor in a suitable manner, for example by electroless or by electrodeposition, as illustrated in FIG. 2 (which is a view of the top or bottom of the device shown in FIG. 1). In one embodiment, the exposed surfaces of foil 10 were electroplated with gold having a thickness of about 0.000100 inch. In this instance, gold was utilized because it facilitates subsequent thermocompression bonding. However, any suitable materials such as nickel, gold, solder or the like may be used. The photoresist 12 is then stripped, leaving the metal foil 10 with gold-plated interconnects 14 on the surfaces thereof. Although only a few beam leads are shown for convenience, there may be many more in varied configurations.

Figure 3:
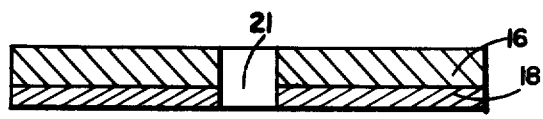
FIG. 3 shows a cross-section of the insulating flexible layer in accordance with principles of this invention.

Although the next step (see FIG. 3) is designated step 3, it may be performed at any time prior to, concurrent with, or subsequent to the first or second steps. An insulating flexible layer 16 of a suitable insulating material, for example an organic resin known as a polyimide such as Kapton, is prepared. The insulating material should be able to withstand temperatures which are normally used in packaging integrated circuit devices and must also be capable of withstanding the exposure to etching and the cleaning steps used in these packaging processes. In one embodiment, insulating flexible layer 16 is a 0.001 inch thick polyimide film. A thick, modified epoxy adhesive layer 18, about 0.001 inch thick, is applied to polyimide layer 16 for purposes of adhering to foil 10. In one embodiment, low flow adhesive was utilized to prevent the adhesive from flowing into the beam leaded pattern. Typically, the adhesive film is carried on a paper slip sheet and placed in contact with the polyimide layer 16. Transfer of the adhesive to the polyimide surface is accomplished by using pressure and heat. The adhesive coated polyimide layer 16 is punched forming cavities 21 for subsequent use as receptacles for device chips. Although in the example, the insulating layer 16 has a rectangular configuration, the shape may be altered in any way which is suitable for the interconnections which are to be made.

Figure 4:
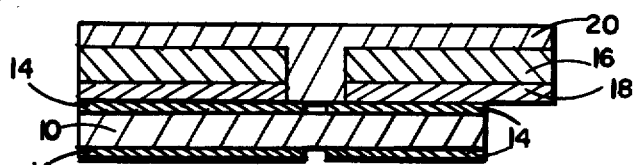
FIGS. 4–7 depict cross-sections of the connecting structure during various stages of the method for forming on the insulating flexible layer the beam lead interconnections for connection to an integrated circuit chip.

In step four, the pre-punched, adhesive-coated, insulating layer 16 (FIG. 3) is laminated to the gold-plated copper foil 10 (FIG. 1), as shown in FIG. 4. First, the adhesive coated surface 18 of the polyimide layer 16 is laid up to foil 10 (and interconnects 14) for the lamination step. Normally, the thin copper foil 10 would be damaged by the pressure and heat of the lamination into the cavities and as a result would tear, sag or crack. However, in a preferred embodiment of this invention, a plastic backing 20, such as vinyl or the like, is applied to the back of the insulation layer 16 prior to the lamination step. When the heat and pressure are applied to laminate the structure, vinyl backing 20 is extruded into and substantially fills the cavity 21, thereby preventing deformation of the non-supported area of foil 10 that is disposed over the cavity area. The vinyl backing 20 remains with the composite during the subsequent processing steps functioning as a cushion and as a protective mask if further etching is required. The resulting laminate of plated metal foil 10, metal-coated interconnects 14 and coated polyimide layer 16 with the vinyl backing 20 is shown in FIG. 4. Only one cavity is illustrated in FIG. 4, for convenience, but the strips of insulating material 16 may be long, continuous strips including as many cavities as desired depending on the circuit design.

Figure 5:
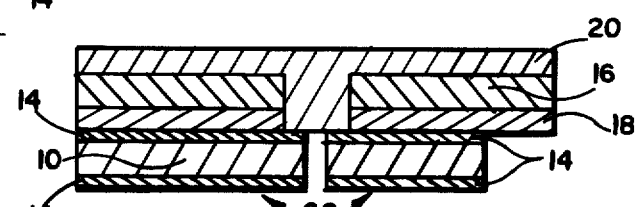

In step 5, the copper foil 10 portions which are not electroplated (see FIG. 2) are etched, as shown in FIG. 5, leaving electroplated copper, beam lead interconnects 22. The electroplated portions of the surface serve as a resist for the etching process. The beam lead pattern includes one or more metallic leads 22 each being adjacent to cavity 21 and extending inwardly beyond the periphery of cavity 21 (now filled with the backing 20 material) depending on the type of device that will be interconnected.

Figure 6:
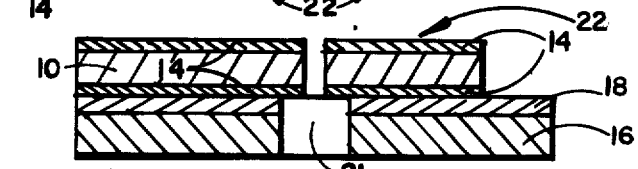

In step 6, the composite as shown in FIG. 6 is inverted 180° showing vnyl 20 removed from the beam lead laminate layer 16 leaving beam lead interconnects 22 extending over cavity 21. Beam leads 22 remain attached, by adhesive 18, to the polyimide layer 16.

Figure 7:
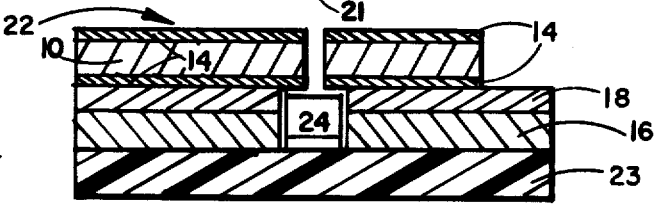

Referring to FIG. 7, the laminated composite is placed over a substrate 23 supporting a device 24 such that the device 24 is positioned within the cavity 21. The beam leads 22 now can be joined to the device 24 in a suitable manner such as by thermocompression bonding.

Figure 8:
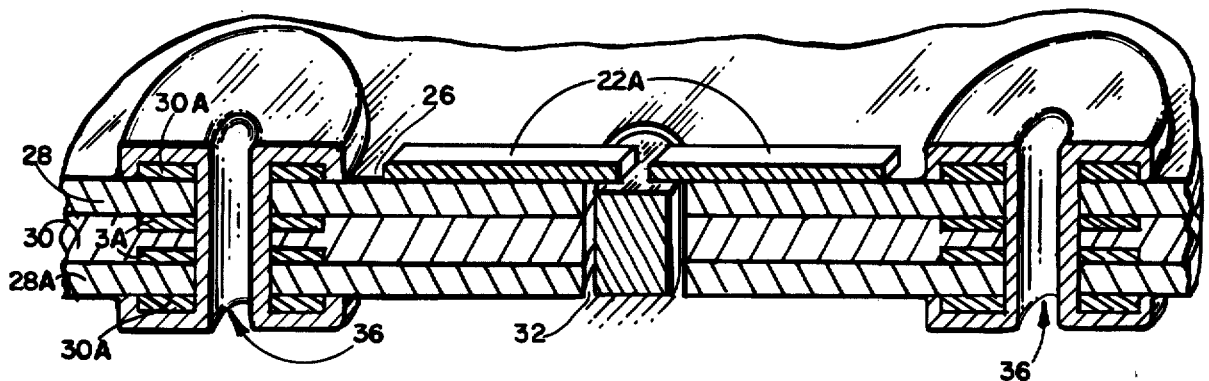
FIG. 8 depicts another embodiment of the invention.

FIG. 8 depicts another embodiment of this invention which includes forming a plurality of individual circuit layers and insulating layers into a multilayer circuit. In this embodiment, beam leads are formed from a metal foil substantially in accordace with the description above.

Thus, a metal foil 26 (similar to foil 10) is processed in accordance with step 1 of the first embodiment of this invention. A beam lead interconnection pattern is formed by well known photolitographic techniques on one surface only of foil 26. The metal foil 26, typically is copper which is plated for example with gold or nickel. The resist is stripped, leaving the plated beam lead interconnects 22A.

In step 2, the individual circuit layers and the insulating boards are fabricated. Depending upon the required design, the circuit boards may be copper-clad epoxy glass with the required circuitry pattern formed on one or both sides of the epoxy glass. The insulating boards 28 do not have copper surfaces. Instead, they will be coated with an adhesive on both sides and are utilized to bond the circuit boards 30 and the copper foil 26 for forming a multilayer composite. When the circuit pattern is to be formed on one side of the epoxy glass insulator 28, then it is coated with an adhesive film on the opposing side which is located in the structure at 28A. All boards are pre-punched to form cavities 32 for fitting integrated circuit elements or chips.

In step 3, the multilayer composite is laid-up to the gold plated copper layer 26 for the lamination step. The top layer of the composite is an insulating board 28 and the bottom layer is an insulating board 28A. In a preferred embodiment, a vinyl cushion is placed on the bottom layer of the multilayer composite as explained in step four of the first embodiment described herein. During lamination of copper layer 26 and the multilayer composite, the vinyl cushion flows into the cavities of the multilayer composite forming a protective backing for foil 26.

In step 4, through holes 36 are drilled on each side of the composite for interconnecting the individual circuits of the respective circuit layers making up the multilayer composite. The through holes 36 are plated in a suitable manner, for example by electroless plating, followed by electrolytic copper plating for about ten minutes.

In step 5, after the ten-minute plating step, the cavities 32 of the plated board (except the through holes and any other circuitry that is to be built up) is coated with photoresist and patterned to expose the through hole and selected circuitry for further build up if required. When the required amount of plated build up is achieved, further plating follows with an etch resisting metal such as tin.

In step 6, the photoresist is stripped and the vinyl cushion is removed. The copper foil is etched to leave the gold-plated beam leads 22A, as illustrated in FIG. 8, Thus, it is shown that a beam leaded multilayer circuit can be fabricated embodying the principles of the instant invention.

It should be understood that the steps 1 and 2 can be modified or even eliminated while still performing the inventive method. In modifying steps 1 and 2, the electroplated material may be placed on only one surface of foil 10 to provide the etch mask on the bonding surface. On the other hand, the mask can be photoresist or the like in each instance. Moreover, the plating (if used) can be placed merely at the ends of the beam leads.

Thus, it will be appreciated by those skilled in the art that the invention may be carried out in various ways and may take various forms and embodiments other than the illustrative embodiments heretofore described.

Accordingly, it is to be understood that the scope of the invention is not limited by the details of the foregoing description, but is defined in the following claims.

We claim:

1. A method for fabricating beam lead interconnect circuits comprising the steps of:
   processing a metal layer to form a pattern of beam lead interconnections thereon;
   coating a layer of insulation material on a first surface with an adhesive;
   forming at least one cavity through said insulation layer for supporting a device;
   coating said insulation layer on a second surface with a plastic material;
   laminating at a suitable temperature and pressure said metal layer to the adhesive coated first surface of said layer of insulation material and substantially, concurrently forcing said plastic material into each cavity in said insulation layer to form a backing to prevent deformation of said metal layer;
   etching the surfaces of said metal layer except the pattern portion thereof to form beam lead interconnections; and
   removing said plastic material and leaving a cavity having said beam lead interconnections cantilevered over said cavity ready for connection to said device.

2. The method as recited in claim 1 wherein said metal layer is selected from the group consisting of copper and aluminum.

3. The method as recited in claim 1 wherein said exposed interconnection pattern is plated with gold, nickel or solder.

4. The method as recited in claim 1 wherein said plastic material is polyvinyl chloride film.

5. The method as recited in claim 1 wherein a plurality of circuit layers and insulating layers with interconnections are laminated to said metal layer during the laminating step.

6. The method as recited in claim 1 including the steps of
   plating a pattern of beam lead interconnections during said processing step; and
   etching the non-plated surfaces of said metal layer to form plated-metal beam lead interconnections after the laminating step.

7. The method as recited in claim 5 wherein said interconnections are made by drilling holes through said circuit layers and said insulating layers, plating the inner surface of said holes by electroless plating, followed by an electrolytic copper plating build up and a finishing plating layer of tin.

8. The method recited in claim 1 wherein said processing step includes
   applying a mask to said metal layer, and
   photolithographically removing portions of said mask from said metal layer to expose said pattern.

9. The method recited in claim 1 including the steps of
   placing a circuit device within said cavity in the laminated composite,
   placing a substrate under said laminated composite, and
   bonding said cantilevered beam leads to said circuit device.

10. A method for fabricating beam lead interconnect circuits comprising the steps of:
    processing a metal layer comprising a copper foil to form a beam lead interconnection pattern;
    gold plating the exposed interconnection pattern,
    coating a first surface of an insulation layer of flexible insulating material with an adhesive;
    forming at least one cavity in said insulation layer;
    coating a second surface of said insulation layer with a plastic material;
    laminating said metal layer to said adhesive coated first surface of said insulation layer thereby at a suitable temperature and pressure to substantially and concurrently force said plastic material into each cavity in said insulation layer to form a backing to prevent deformation of said metal layer;
    etching the non-plated surfaces of said metal layer to form plated-metal lead interconnects;
    removing said plastic material and leaving a cavity having said beam lead interconnects cantilevered over said cavity.

* * * * *